(12) United States Patent
Holdredge et al.

(10) Patent No.: US 8,085,554 B2
(45) Date of Patent: Dec. 27, 2011

(54) AIR INLET DIFFUSER

(75) Inventors: Paul Holdredge, Whitefish Bay, WI (US); James R. Hamstra, Tigard, OR (US)

(73) Assignee: Flextronics Sales and Marketing (A-P) Ltd, Ebene (MU)

( * ) Notice: Subject to any disclaimer, the term of this patent is extended or adjusted under 35 U.S.C. 154(b) by 132 days.

(21) Appl. No.: 12/553,412

(22) Filed: Sep. 3, 2009

(65) Prior Publication Data
US 2009/0323282 A1 Dec. 31, 2009

Related U.S. Application Data

(62) Division of application No. 11/280,784, filed on Nov. 16, 2005, now Pat. No. 7,589,978.

(60) Provisional application No. 60/675,136, filed on Apr. 27, 2005.

(51) Int. Cl.
*H05K 9/00* (2006.01)

(52) U.S. Cl. .................. 361/818; 361/816; 361/794

(58) Field of Classification Search .................. 361/816, 361/818, 800, 797, 799, 807, 810, 600, 679.01, 361/688–690, 694–695, 704, 707, 717–721; 174/69, 143, 156, 184
See application file for complete search history.

(56) References Cited

U.S. PATENT DOCUMENTS

| | | | |
|---|---|---|---|
| 4,399,485 A | 8/1983 | Wright et al. | |
| 4,498,118 A | 2/1985 | Bell | |
| 5,063,477 A | 11/1991 | Paggen et al. | |
| 5,361,188 A | 11/1994 | Kondou et al. | |
| 5,914,858 A | 6/1999 | McKeen | |
| 6,168,393 B1 | 1/2001 | Homola | |
| 6,185,109 B1 | 2/2001 | Koradia et al. | |
| 6,222,729 B1 | 4/2001 | Yoshikawa | |
| 6,252,161 B1 | 6/2001 | Hailey et al. | |
| 6,426,459 B1 | 7/2002 | Mitchell | |
| 6,567,276 B2 * | 5/2003 | Kopf et al. | 361/818 |
| 6,610,922 B1 | 8/2003 | Twiss et al. | |
| 6,680,847 B2 | 1/2004 | Heard | |
| 6,780,042 B1 | 8/2004 | Malmberg | |
| 7,230,827 B2 | 6/2007 | Sun et al. | |
| 7,450,377 B2 | 11/2008 | Matsumoto et al. | |
| 7,679,920 B2 * | 3/2010 | Musciano et al. | 361/721 |
| 2002/0154493 A1 | 10/2002 | Kopf et al. | |

* cited by examiner

*Primary Examiner* — Hung S Bui
(74) *Attorney, Agent, or Firm* — Russell T. Manning; Robert G. Crouch; Marsh Fischmann & Breyfogle LLP

(57) ABSTRACT

An air inlet diffuser 10 is disclosed for attachment relative to an air inlet opening 106 of an electronics enclosure 100. The diffuser 10 extends into the electronics enclosure 100 and provides an increased surface area through which EMI attenuating apertures may be formed. The diffuser 10 also reduces the amount of structure that is disposed within the air inlet opening 106 thereby reducing impedance to airflow through the opening 106 into the enclosure 100. The increased surface are of the diffuser 10 allows for increasing the number of EMI attenuating apertures that may be utilized for a given inlet opening 106. In one embodiment, the total open area of the EMI apertures is greater than the open area of the air inlet opening. In such an embodiment, the EMI apertures provide low impedance to airflow through the diffuser 10 and increased airflow in conjunction with EMI attenuation may be realized.

21 Claims, 7 Drawing Sheets

AIR INLET DIFFUSER

CROSS REFERENCE TO RELATED APPLICATION

This application is a divisional application of U.S. application Ser. No. 11/280,784 entitled: "Air Inlet Diffuser" which was filed Nov. 16, 2005 and which claims the benefit of the filing date, under 35 U.S.C. §119, of U.S. Provisional Application No. 60/675,136 entitled: "Air Inlet Diffuser" which was filed on Apr. 27, 2005, the contents of both of which are incorporated herein by reference.

BACKGROUND

The operation of electronic devices such as computers, televisions, telecommunications devices, medical instruments, and the like is attended by the generation of electromagnetic radiation by the electronic circuitry of the devices. Such radiation often develops as an electric field or as transients within the radio frequency band of the electromagnetic spectrum and is generally termed "electromagnetic interference" ("EMI") and/or "radio frequency interference" ("RFI"). Left un-attenuated, such EMI may interfere with the operation of other nearby electronic devices.

To attenuate EMI effects, shielding having the capability of absorbing and/or reflecting EMI energy may be employed. Such shielding may both confine the EMI energy within a source device, and insulate that device from other EMI sources. Such shielding is generally configured as an electrically conductive and grounded housing/enclosure that surrounds the EMI generating circuitry of the source device.

An ideal EMI enclosure would be completely sealed and would provide almost complete EMI shielding. However, most electronic devices and in particular microprocessors generate large amounts of heat energy that must be removed from the enclosure to permit continued operation of the device. Accordingly, most enclosures designed for EMI shielding contain multiple ventilation apertures or other electrically grounded perforated/porous structures (e.g., screens) to permit airflow for cooling purposes.

If properly sized, openings through an electronics enclosure may contain EMI within the enclosure. More specifically, an opening within the enclosure will prevent propagation of electromagnetic waves if the maximum dimension of the opening is less than about one-fourth of the smallest wavelength (highest frequency) to be attenuated. Accordingly, the maximum dimension (e.g., diameter of a circular opening) is inversely related to the operating frequency of the electronic circuitry within the enclosure. For instance, an electronic device operating at 3.0 GHz may result in non-negligible harmonic frequencies as high as 15 GHz. To prevent waveform propagation at such frequencies, openings may be restricted to a maximum allowable dimension of 5 mm or less. Accordingly, as operating frequencies of electronic devices continue to increase, the maximum allowable dimension of ventilation apertures within electronic enclosures continues to decrease.

As the maximum size of ventilation apertures decreases, the impedance of each aperture to air flow increases. This is due in part to boundary effects of the periphery of the ventilation apertures on fluids passing through the aperture. Accordingly, to provide adequate fluid flow for cooling purposes, the surface area of electronics enclosures dedicated to ventilation apertures for cooling electronics has increased with the increase of operating frequencies.

Increasing the surface area on electronics enclosures dedicated to ventilation openings conflicts with other trends in electronics devices, namely, increased power/computing density and reducing the size of electronics enclosures. In many applications (e.g., telecommunications centers, server farms, etc.) it is desirable to increase the number of components (e.g., circuit boards, processors etc.) incorporated into a single electronics enclosure while reducing the overall size of the electronics enclosure. The increased electronic component density of such electronics enclosures may require that more of the surface area of the electronics enclosure be dedicated to electrical connectors, power supplies and the like associated with the electronic components within the enclosure. Accordingly, while the area needed for ventilation apertures on the surface of electronics enclosures is increasing, the area available for such ventilation apertures is decreasing.

It is against this background that the present invention has been developed.

SUMMARY

In one aspect, an air inlet diffuser for disposition relative to an opening through a surface of an electronics enclosure is provided. The air inlet diffuser includes an end surface and a sidewall attached to the end surface. The end surface and sidewall generally define a hollow body. The sidewall defines an open end that is adapted for interconnection to a surface of an electronics enclosure that contains an inlet aperture. A plurality of EMI attenuating apertures extending through the sidewall and the combined area of the EMI attenuating apertures is greater than an area of the open end of the diffuser. In one arrangement, the area of the EMI attenuating apertures is at least twice as great as the area of the air inlet. In other arrangements, the area of the EMI attenuating apertures is at least 5 times greater than the area of the air inlet.

Generally, the maximum dimension of the EMI apertures will be less than about 5 mm to prevent propagation of EMI. In any case, the open end of the diffuser may be sized to allow air to enter the open end of the diffuser with little impedance. The open end may define a first reference plane. In one arrangement, the plurality of EMI apertures may be at least partially transverse to this reference plane. For instance, in an arrangement where the EMI diffuser is substantially a rectangular box with the open end at one end of the box (e.g., defining a reference plane), the EMI apertures may extend through one or more of the sidewalls of the box. One or more sidewalls may likewise be free of EMI apertures. Outside surfaces of the diffuser may also include structure (e.g., baffles) for directing airflow passing through the EMI apertures.

According to another aspect, an EMI shielded enclosure is provided. The enclosure includes a plurality of electrically conductive walls that define the enclosure. The walls are electrically interconnected. At least one air inlet opening extends through a first wall of the plurality of walls. An air inlet diffuser is interconnected to the first wall relative to the air inlet opening. The air inlet diffuser includes a hollow body having an opening aligned with at least a portion of the air inlet opening and a plurality of EMI attenuating holes extending through a sidewall of the hollow body. A combined area of the EMI attenuating apertures is greater than an area of the air inlet opening.

Generally a portion or all of the air inlet diffuser may be disposed within said enclosure. Further, the air inlet diffuser may be interconnected to the first wall about the periphery of said air inlet opening such that air passing through the air inlet opening passes through the EMI apertures.

The EMI apertures may be extend through the surface of the hollow body to permit directing the air passing though the diffuser to a direction that is transverse to the direction the air passes through the air inlet opening. In this regard, the air may be directed onto on or more circuit boards included within the enclosure. For instance, the air inlet diffuser may be disposed between first and second circuit boards and may direct airflow onto each circuit board. For instance, the air inlet diffuser may include a first set of apertures for directing airflow onto a first circuit board and a second set of apertures for directing airflow onto a second circuit board. Accordingly, the enclosure may include a fan that is adapted to draw ambient air through the air inlet diffuser.

According to another aspect of the invention, a method for use in an EMI shielded electronics enclosure is provided. The method includes first drawing air though an air inlet opening into a hollow body disposed within the electronics enclosure, where the air is drawn through the opening in a direction that is normal to the air inlet opening. The air is then secondly drawn through a plurality of EMI attenuating apertures extending through a sidewall surface of the hollow body, wherein a majority of the air is redirected to a direction transverse to the air inlet opening. The air is then exhausted from the electronics enclosure. In one arrangement, the air is directed onto the surface of one or more heat generating elements (e.g., circuit boards) in conjunction with the second drawing of the air. To increase airflow through the hollow body, laminar flow may be maintained through the hollow body.

According to another aspect, an air inlet diffuser for attachment relative to an aperture of an electronics enclosure is provided. The diffuser includes a recessed body and an open end of the recessed body that is adapted for attachment about an aperture in an electronics enclosure. A plurality of EMI attenuating apertures extend through the recessed body and a combined area of the EMI attenuating apertures is greater than an area of the open end.

According to another aspect, an air inlet diffuser is provided that includes a diffuser body having one or more walls defining a hollow interior and an inlet opening. The inlet opening defines a surface area. At least one wall of the diffuser body has a plurality of apertures defined therein, the apertures each having a maximum dimension that is related to a desired characteristic of the diffuser. The combined surface areas of the apertures in the at least one wall of the diffuser body is larger than the surface area of the inlet opening.

DETAILED DESCRIPTION

Reference will now be made to the accompanying drawings, which assist in illustrating the various pertinent features of the present invention. Although described primarily herein in conjunction with an EMI diffuser utilized for an air inlet of electronics rack, which houses multiple individual electronic boxes, it should be expressly understood that certain aspects of the EMI diffuser and/or electronics boxes may be applicable to other applications where EMI attenuation in conjunction with ventilation openings is required/desired. Such applications may include, without limitation, personal computers. In this regard, the following description is presented for purposes of illustration and description. Furthermore, the description is not intended to limit the disclosed embodiments to the form disclosed herein. Consequently, variations and modifications commensurate with the following teachings, and skill and knowledge of the relevant art, are within the scope of the present application.

Figure 1:
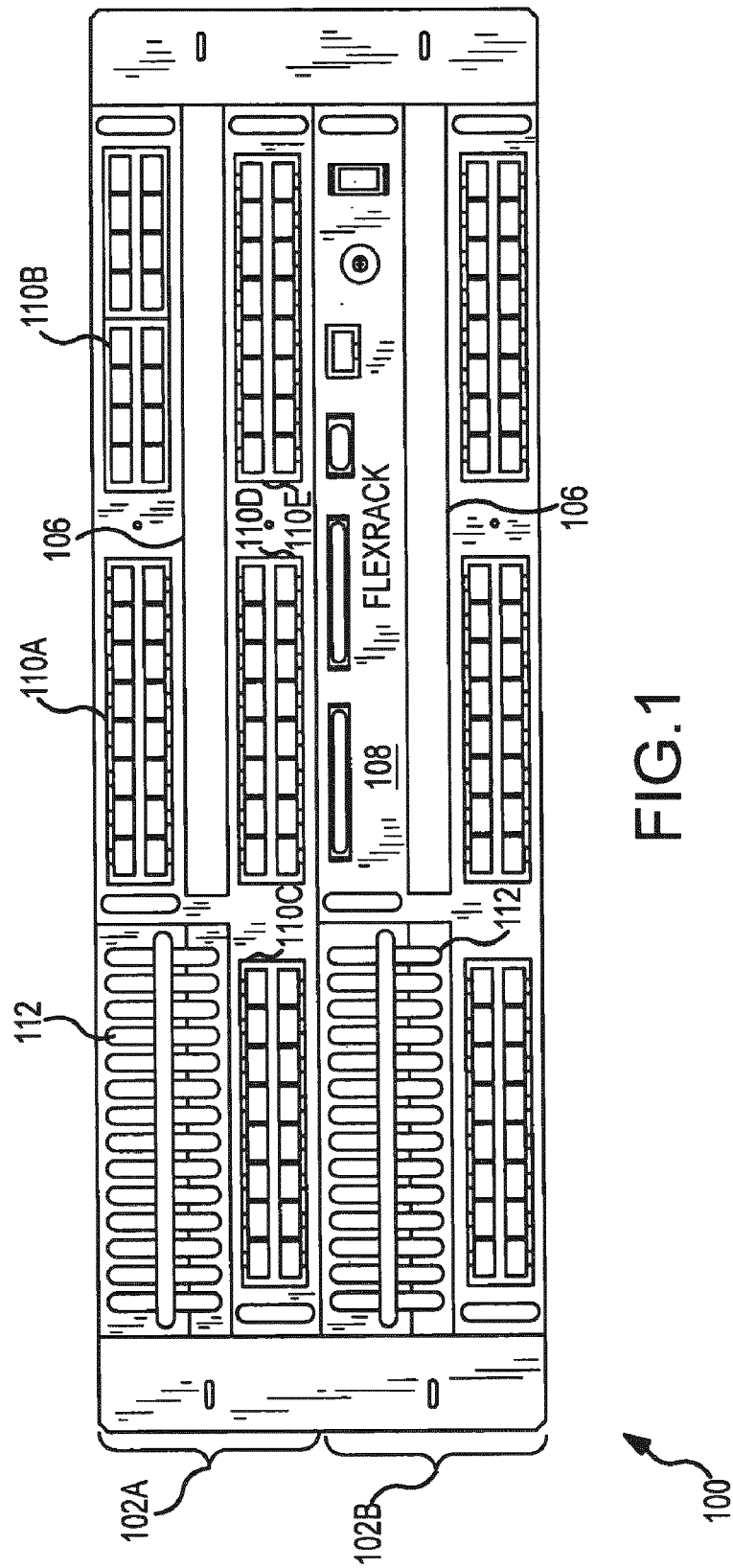
FIG. 1 is a front view of an electronics enclosure.
Figure 2:
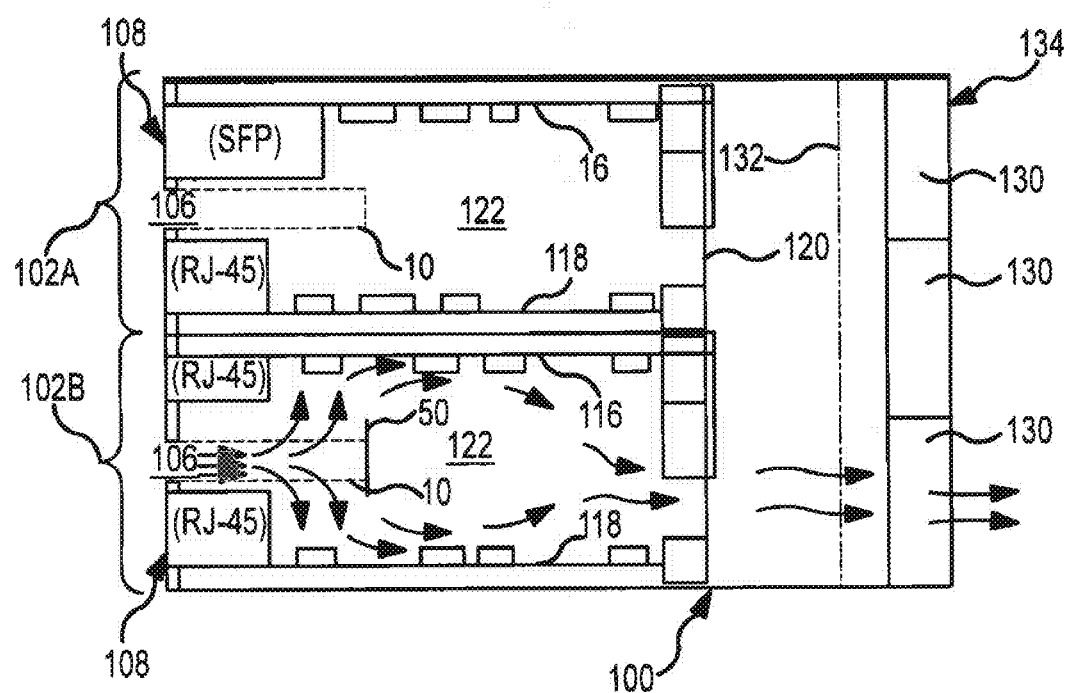
FIG. 2 is a cross-sectional side view of the electronics enclosure of FIG. 1.

FIGS. 1 and 2 illustrate front and cross sectional side views, respectfully, of one exemplary electronic enclosure 100 that incorporates an air inlet diffuser 10. As shown, the enclosure 100 is utilized to house multiple individual electronic boxes 102A-B. That is, individual electronic boxes 102A and 102B may be stacked within the enclosure 100. In this regard, the enclosure 100 may be considered an electronic chassis or rack the size of which may be selected for desired purposes. For instance, in one application a rack having a height of seven feet is utilized to house twenty-four individual boxes, which may be operatively interconnected within the enclosure 100. In any case, enclosure 100 is typically comprised of steel, aluminum or other suitable metallic material in order to provide EMI shielding. As discussed herein, any reference to a box 102 or component of the box 102 is meant to refer to any box 102A-N within the enclosure 100 unless a particular box (e.g., 102A) is indicated.

As shown in FIG. 1, each box 102 includes a plurality of components (e.g., connectors 110, power supplies 112, etc) on the front surface 108 of the box 102. Generally, multiple connectors 110 are disposed on the front surface 108 of the box 102 to allow easy access thereto. These components are interconnected to circuit boards such as circuit boards 116 and 118 that are enclosed within the enclosure 100, as shown in FIG. 2. For instance, in box 102A a top row of connectors 110A, 110B and a power supply 112A are interconnected to a first daughter board 116, which is itself interconnected to a back panel circuit board 120 (PCB). A second row of connectors 110C-E are interconnected to a second daughter board 118 that is likewise interconnected to the back panel PCB 120. The number, type and orientation of components may vary. In the embodiment shown, the first and second daughter boards 116, 118 are mounted in a facing relationship. That is, one daughter board 118 is mounted right-side up while another daughter board 116 is mounted upside down.

The daughter boards 116, 118 typically extend across the width of the box 102 while the back panel PCB 120 may only extend across a portion of the box 102 and/or enclosure 100 to permit airflow across the back panel PCB, as will be more fully discussed herein. Additionally or alternatively, the back panel PCB may also contain apertures (not shown) to permit airflow therethrough. The front surface 108 of the box 102, side surfaces (not shown) of the box 102 and/or enclosure 100, the first and second daughter boards 116, 118 and the back panel PCB 120 define a partially enclosed space 122 as shown in FIG. 2. In operation, the daughter boards 116, 118 and back panel PCB 120 may generate a significant amount of heat. To ensure continued functioning of the circuit boards 116, 118 and 120, cooling typically must be provided for the partially enclosed space 122.

Forced air or 'airflow cooling' is typically utilized for electronics enclosures where ambient air is drawn or forced through the electronics enclosure 100. One airflow cooling option utilizes side-to-side airflow through the sides of the electronics enclosure 100 and between the daughter boards 116, 118. However, it is common practice to arrange a bank of electronic enclosures side-to-side. In such instances, there may be no available ambient air between the electronics enclosures for cooling purposes. Accordingly, the present arrangement utilizes what may be termed front-to-back airflow cooling to provide cooling between the horizontally mounted daughter boards 116, 118. Typically, the front surfaces 108A-N of multiple boxes 102A-N in an electronics enclosure rack will be disposed in a direction where they may be accessed. Accordingly, ambient air is typically available in front of such electronics enclosures for cooling purposes. However, the available space on the front surface 108 of each box 102 through which ambient air may be drawn is limited due to the density of components thereon.

To provide front-to-back airflow cooling, the electronics enclosure 100 further includes one or more fans 130 mounted relative to its back surface 134. The fans 130 are operative to draw air through an air inlet opening 106 on the front surface 108 of the box 102 between the first and second daughter boards 116, 118, through an opening in the back panel PCB 120 (not shown) and exhaust the air out the back surface 134 of the enclosure 100. That is, each of the plurality of boxes 102A-N in the electronics enclosure 100 includes an air inlet opening 106A-N to permit airflow between opposing circuit boards.

In order to prevent propagation of EMI from electronics within the enclosure 100 through the air inlet openings 106A-N and/or through exhaust openings of the fans 130 in the back surface 134 of the electronics enclosure 100, the openings include EMI shielding. The exhaust openings of the fans 130 are shielded utilizing a continuous EMI screen 132 that extends from the top to the bottom of the electronics enclosure 100 and across its width. The screen 132 may be disposed between the back panel PCB 120 and the front of the fans 130. In one arrangement, the screen 132 is behind the plane of the back panel PCB 120 and upstream of the fans 130. In one particular arrangement, the screen 132 is formed at least in part by holes bored through the back panel PCB 120. In any case, it may be desirable to provide EMI shielding upstream of the fans 130 such that EMI gaskets about the fans are not necessary and/or so the fans may have larger openings in their grilles for improved displacement. However this is not a requirement and the screen 132 may be disposed on the exhaust side of the fans 130. Individual apertures within the screen 132 are sized to prevent EMI propagation. The large surface area of the screen 132 provides a combined open area through the screen 132 that is large enough to allow airflow through with little restriction. That is, the screen 132 provides low impedance to airflow.

In contrast, there is little available surface area on the front surface 108 of each box 102 for the air inlet opening 106 due to the dense packing of the connectors thereon. Furthermore, the air inlet opening 106 requires EMI shielding for attenuation purposes. EMI shields with attenuating apertures (e.g., perforations, holes, grills, screens, etc.) that are sized to prevent propagation of EMI may be disposed over the air inlet opening 106. However, such EMI shields reduce the open area through the air inlet opening 106 and further impede airflow through the air inlet opening 106. This impedance is due to fluid flow phenomena that occurs when fluid flows near a surface. Specifically, the geometry of an EMI shield directly affects the total possible airflow rate through the air inlet opening 106 by causing fluid pressure drops across the boundary of the EMI shield. This fluid pressure drop is a function of hole geometry, fluid flow speed, fluid properties and the total open area through the EMI shield. By increasing the total open area through an EMI shield, a smaller pressure drop may result across cross the shield, thereby resulting in increased fluid flow through the diffuser, as will be discussed herein.

To provide adequate airflow for cooling purposes through the inlet opening 106 while providing effective EMI shielding, an air inlet EMI diffuser 10 (hereafter diffuser 10) in accordance with the teachings of FIGS. 3-7 is utilized. The diffuser 10, as will be more fully discussed herein, increases the area available for an EMI shield for an air inlet opening to permit an increased fluid flow through the opening. The diffuser 10 also reduces the amount of structure that is disposed within the aperture of the air inlet opening 106 to further reduce impedance to airflow through the air inlet opening 106 into the enclosure 100. This permits increased airflow through the air inlet opening 106 for cooling purposes.

Figure 3A:
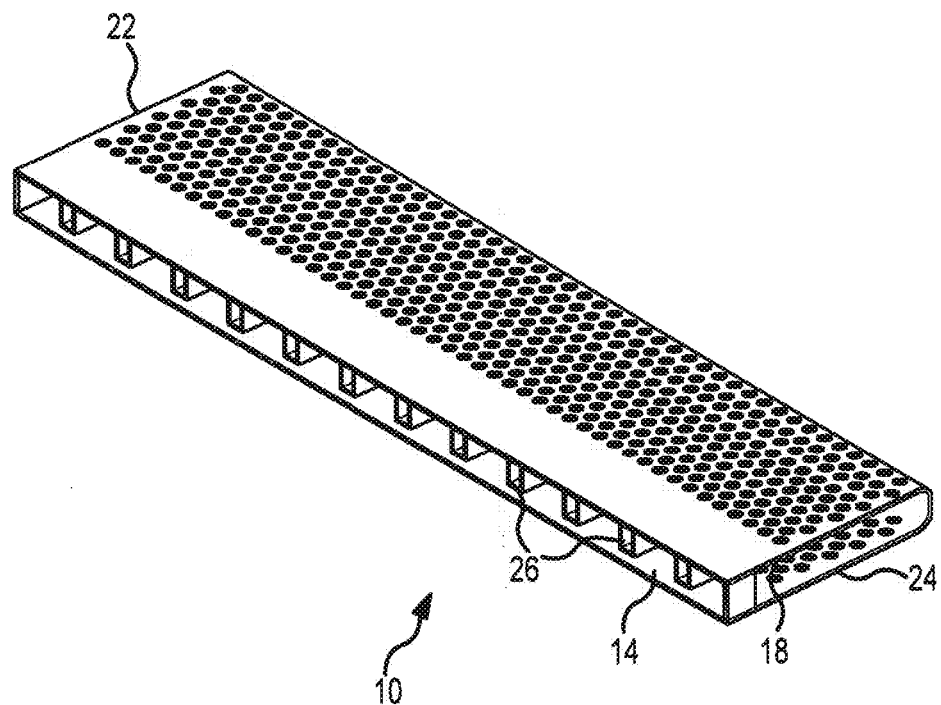
FIGS. 3A and 3B are a perspective and cross-sectional view, respectively, of a first embodiment of an air inlet EMI diffuser.
Figure 3B:
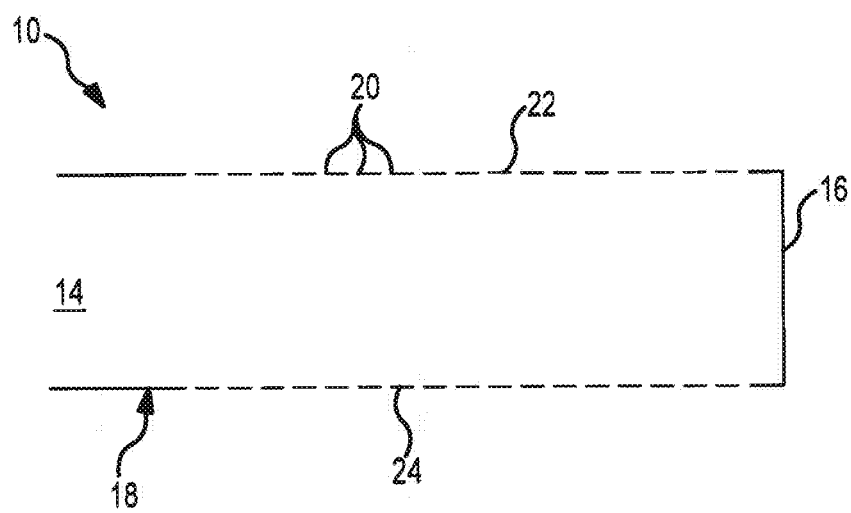

As shown in FIGS. 3A-B, the diffuser 10 is generally formed as hollow body 18 having: an open end 14 adapted to interface with a surface of an electronics enclosure (e.g., encompassing an aperture through the enclosure); a back wall 16; and top and bottom walls 22 and 24 that extend between the open end 14 and the back wall 16. In the present embodiment, the top wall 22, bottom wall 24, and the back wall 16 define the hollow body 18 of the diffuser 10. Sidewalls may also be incorporated into the body 18 of the diffuser 10 or side surfaces of the box 102/enclosure 100 may form the sidewalls of the diffuser 10. A number of vanes 26 extend between the top wall 22 and bottom wall 24 to provide additional rigidity for the diffuser 10. The size, number and location of such vanes 26 may be selected to minimize obstruction of the open end 14. That is, the open end 14 of the diffuser 10 is preferably devoid of significant structure such that it provides little or no impedance to airflow into the diffuser 10. Other embodiments may use a single continuous sidewall (e.g., circular) to define the body of the diffuser. In any case, the body 18 defines a hollow interior volume having an opening thereto.

A plurality of EMI attenuating apertures 20 extend through the body 18 to permit airflow though the diffuser 10 from the hollow interior to the exterior of the diffuser 10. As shown in FIGS. 3A and 3B, the EMI apertures 20 extend through the top wall 22 and bottom wall 24. This arrangement permits redirecting incoming airflow that is typically normal to the open end 14 of the diffuser to a direction that is transverse (e.g., substantially perpendicular) to the air inlet opening 106. Benefits of redirecting of the air inlet flow will be more fully discussed herein.

As shown in FIG. 2, the diffuser 10 extends into the interior of the box 102. More specifically, the diffuser 10 extends from the front surface 108 of the box 102 into the partially enclosed space 122 between the first and second daughter boards 116, 118. The open end 14 of the diffuser 10 is interconnected to the box 102 such that it encompasses the perimeter of the air inlet opening 106. A seal is formed between the open end 14 of the diffuser 10 and a surface of the box 102 such that any airflow through the air inlet opening 106 must pass through the diffuser 10. An EMI gasket (not shown) may be disposed between the diffuser 10 and the surface of the box 102. In this regard, the diffuser 10 may be considered a duct interconnected to the air inlet opening 106 where the open end 14 of the diffuser 10 acts as an inlet for the duct. However, it will be appreciated that open end 14 of the diffuser 10 does not provide EMI attenuation/cutoff for electromagnetic radiation. That is, the open end 14 would, by itself, allow EMI propagation. EMI is attenuated by the plurality of EMI attenuating apertures 20 that extend through one or more walls of the body 18 from the hollow interior to the exterior of the diffuser 10.

The body 18 has an increased surface area in relation to the area of the air inlet opening 106. Accordingly, the combined area of the plurality of EMI apertures 20 formed through the body 18 may be greater than the open area of the open end 14 of the diffuser 10 and, hence, greater than the open area of the air inlet opening 106. Stated otherwise, the diffuser 10 provides increased surface area that allows an increased number of EMI apertures 20 to be utilized for an air inlet opening into an electronics enclosure. This increased number of EMI apertures 20 increases the open area through the EMI shielding (i.e., the combined area of the EMI apertures) thereby reducing the impedance to airflow into an electronics enclosure through a ventilation opening. This reduced impedance results in a reduced pressure drop across the diffuser 10.

The EMI apertures 20 are each sized to prevent EMI propagation. The maximum allowable dimension of each EMI aperture 20 is based on the operating frequency of electronics within an electronics enclosure. Generally, the higher the operating frequency the lower maximum dimension of the EMI apertures 20. For instance, the maximum dimension of the EMI apertures 20 may be 5 mm to prevent propagation of EMI from electronics operating in the 3 GHz range, which may have harmonics containing significant energy up to the 15 GHz range. However, it will be appreciated that as operating speeds increase the maximum allowable dimension of the EMI apertures 20 may be reduced. Generally, a maximum dimension of the EMI apertures 20 will be no more than about one-fourth of the wavelength of the highest frequency harmonic in which there is any significant energy within an electronics enclosure.

To reduce the impedance to airflow into the diffuser 10, it is desirable that the open end 14 of the diffuser 10 have little or no obstructing structure and that the open end 14 and interior volume of the diffuser 10 be sized in a manner to reduce fluid flow boundary effects. Fluid flow boundary effects correspond to a region (i.e., boundary layer) close to a surface over which a fluid is flowing, the flow velocity of a fluid varies from zero at the surface up to its full value at the edge of the boundary layer. Outside the boundary layer the fluid moves at full velocity, and may be considered in practice to be unaffected by the reduction of velocity close to the surface. To permit the maximum amount of airflow through the inlet opening 14 and through the interior of the diffuser 10, it may be desirable to minimize thickness of the boundary layer and thereby reduce impedance to airflow through the diffuser 10.

Generally, a laminar fluid flow over a surface has a smaller boundary layer than a turbulent fluid flow over such a surface. For laminar airflow velocities utilized for electronics cooling, boundary effects provide significant impedance to airflow within about one-eighth of an inch of a surface over which the air is flowing. Accordingly, to enhance airflow through the diffuser 10, it may be desirable that a laminar airflow be established through the diffuser 10 and that at least a portion of the open end 14 of the diffuser 10 not be subject to such boundary effects. For instance, if an open end of a diffuser is approximately one-half inch in height and at least one-half inch in width (or greater), a central portion of such an open end would be subject to little or no boundary effects from the interior walls of the diffuser and would permit increased airflow into the inlet diffuser. In any case, it may be desirable that the area of the open end 14 of the diffuser(s) 10 and the volumetric displacement of a fan(s) associated with an electronics enclosure be matched such that a laminar flow through the diffuser(s) is maintained.

In order to maintain the benefits of the low impedance fluid flow into the diffuser 10, it is necessary to reduce impedance to the airflow through the diffuser 10 caused by the EMI apertures 20. As will be appreciated, due to the small maximum dimension of each EMI aperture 20, the fluid flow through each aperture 20 is subject to boundary effects and hence generally high impedance to fluid flow. To overcome this high impedance, the combined area of the EMI apertures 20 is increased in relation to the area of the open end 14 of the inlet diffuser 10. Due to the available surface area of the body 18, a significantly increased number of EMI apertures 20 may be utilized by the inlet diffuser 10. Accordingly, a combined open area of the EMI apertures 20 may be considerably greater than the open area of the open end 14 of the inlet diffuser 10. As will be appreciated, a ratio of EMI aperture open area to the area of the diffuser open end 14 will be a function of the total surface area of the body 18 covered by the EMI apertures 20. This ratio may further depend on the size (e.g., length, width, height) of the inlet diffuser 10. However, a ratio of at least 2:1 will typically be utilized and a ratio of about 5:1 may be utilized. Further ratios of 10:1 or more may be achieved.

Use of an EMI aperture open area that is greater than the area of the open end 14 reduces pressure drop across the diffuser 10 due to conservation of mass flow principles. This also reduces the Reynolds number of airflow through the diffuser 10 thereby permitting higher fluid laminar fluid flows through the diffuser 10. In effect, the increased open area through the diffusers 10 allows for increased fluid flow without necessarily increasing boundary layer impedance though the body of the diffuser.

Figure 4A:
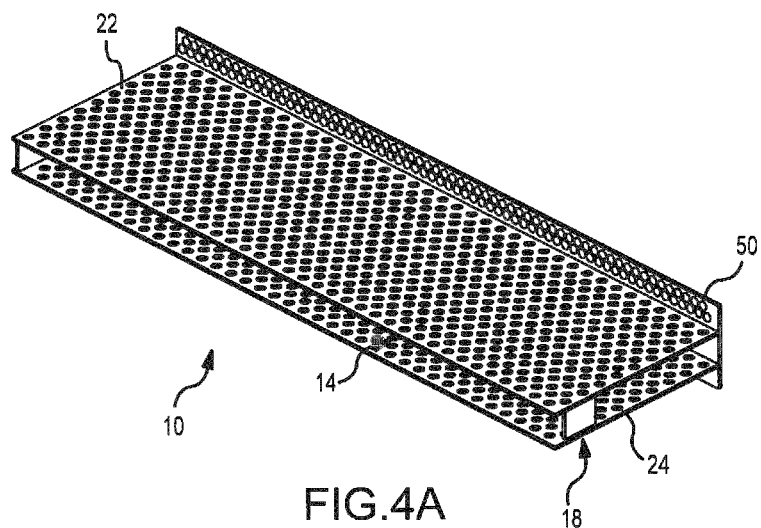
FIGS. 4A and 4B are a perspective and cross-sectional view, respectively, of a second embodiment of an air inlet EMI diffuser.
Figure 4B:
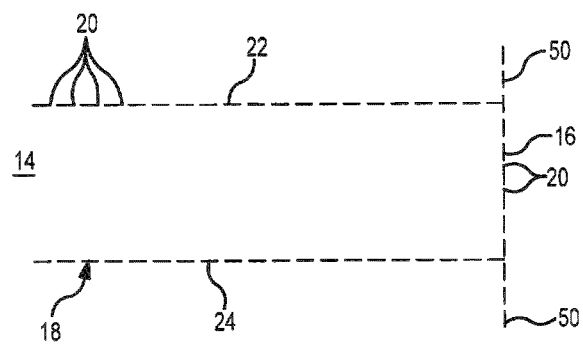

FIGS. 4A-6B show various embodiments of air inlet diffusers 10 that incorporate one or more aspects of the current teachings. As shown in FIGS. 4A and 4B, an inlet diffuser 10 is provided where substantially the entire surface of the body 18 including the back wall 16 of the inlet diffuser 10 includes EMI apertures 20. In this regard, the top wall 22, bottom wall 24, back wall 16 and/or side walls (not shown) may include EMI apertures 20.

Figure 5A:
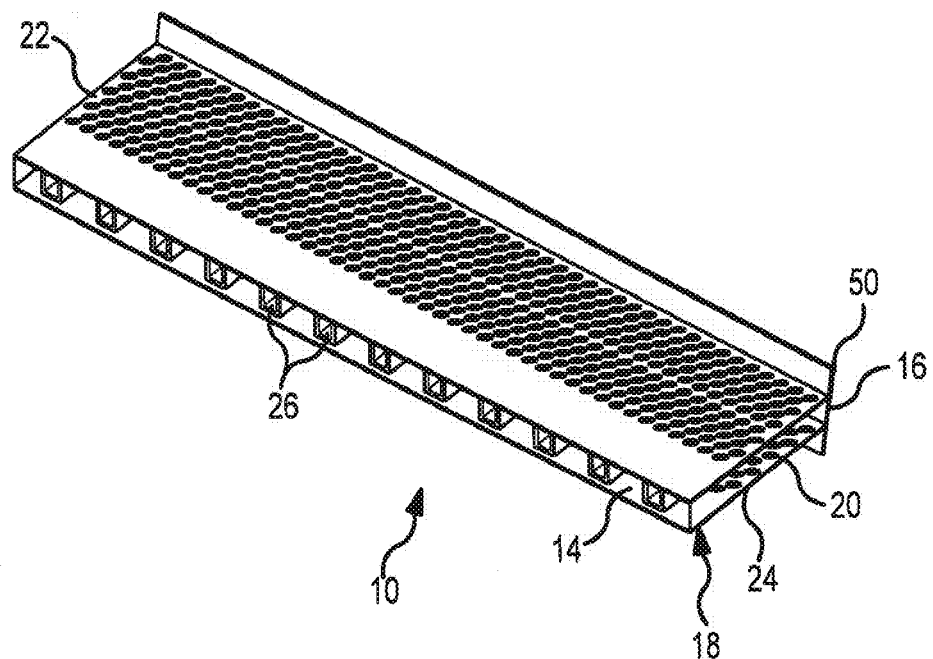
FIGS. 5A and 5B are a perspective and cross-sectional view, respectively, of a third embodiment of an air inlet EMI diffuser.
Figure 5B:
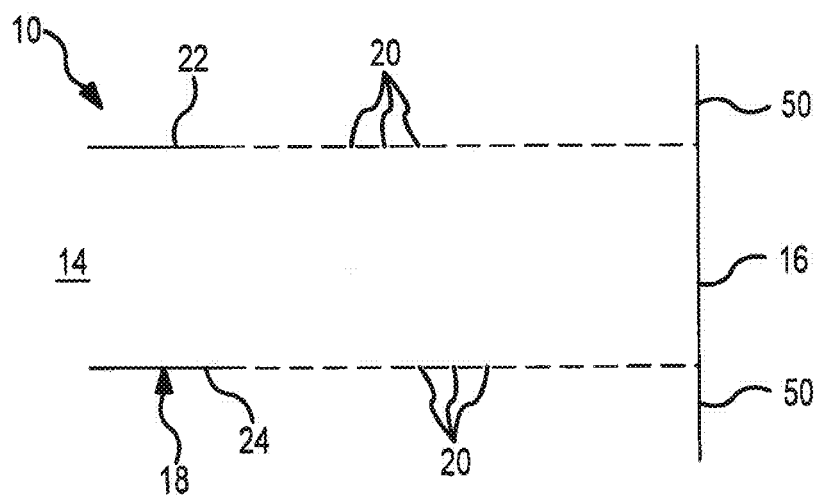

FIGS. 5A and 5B illustrate a second embodiment wherein only the top wall 22 and bottom wall 24 of the body 18 of the inlet diffuser 10 include EMI apertures 20. In this arrangement, no airflow through the diffuser 10 passes through the back wall 16 of the diffuser 10. This permits selectively directing air passing through the diffuser 10. As shown in FIGS. 4A-5B, each diffuser 10 includes an external baffle 50 that is utilized to further redirect airflow that has passed through the EMI attenuating apertures 20.

Figure 6A:
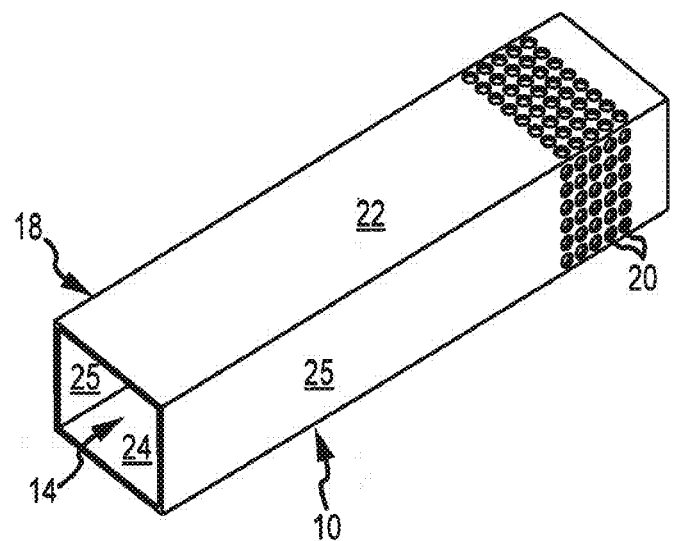
FIGS. 6A and 6B are a perspective and cross-sectional view, respectively, of a fourth embodiment of an air inlet EMI diffuser.
Figure 6B:
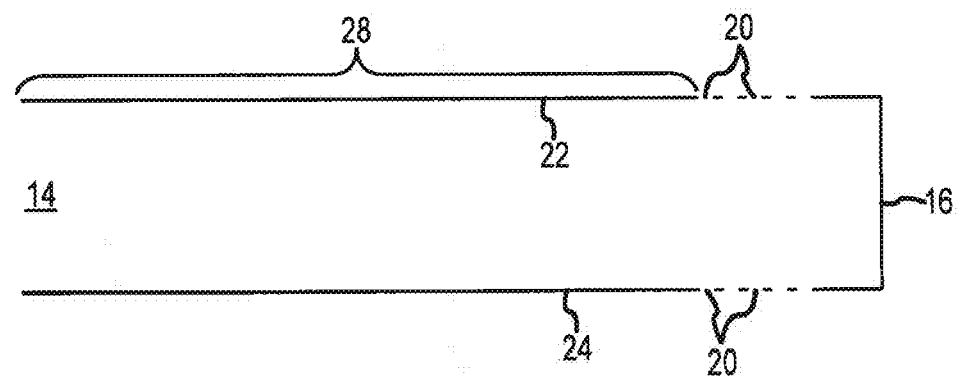

FIGS. 6A and 6B illustrate a further embodiment of the diffuser 10. As shown, the top wall 22, bottom wall 24 and sidewalls 25 include EMI apertures 20 while the back wall 16 is a solid surface. However, unlike the previous embodiments, the inlet diffuser 10 of FIG. 6 includes a section of the body 18 that is free of EMI apertures 20. This creates a duct section 28 that permits directing airflow deeper into an electronics enclosure 100 before it is utilized for cooling purposes. That is, use of such a duct section 28 may permit airflow through the diffuser 10 to be piped to a desired location within an electronics enclosure (e.g., a central location).

Though illustrated herein as having a substantially rectangular cross section in height and width as well as in length and height (i.e., box-shaped) it will be appreciated that the configuration of the body of air inlet diffuser 10 is a matter of design choice. Any cross-sectional shape (e.g., circular) may be utilized so long as an inlet of the inlet diffuser 10 allows for low impedance entry of airflow and EMI apertures through the body of the EMI diffuser allow for low impedance airflow through the diffuser 10 while providing EMI attenuation. One common feature of the illustrated embodiments is that the body of the diffuser provides a recessed surface in relation to a surface through which an air inlet opening is formed. That is, in a cross-sectional profile the body of the diffuser is recessed in relation to the open end of the diffuser. The exact shape of the recess in profile (e.g., concave, rectangular, v-shaped, etc.) is of little importance so long as the recessed surface provides a surface area for EMI attenuating apertures that is greater than the area of the open end of the diffuser and/or an air inlet opening into an electronics enclosure.

In addition to providing increased airflow into the electronics enclosure 100, the diffuser may also provide directionality control for cooling purposes. For instance, the embodiments of the diffuser 10 with EMI apertures 20 on top and bottom walls may be utilized to direct airflow onto the daughter boards 116, 118 of box 102B as shown in FIG. 2. In this regard, the EMI apertures 20 on the top and bottom walls of the diffuser 10 are operable to redirect airflow that enters the diffuser 10 substantially normal to the planar surface defined by the air inlet opening 106. In particular, the diffuser 10 is operative to redirect airflow exiting the diffuser 10 to a direction that is transverse to the airflow entering into the diffuser 10. As shown, this redirected airflow may include a component that is normal to the surface of the daughter boards 116, 118. As will be appreciated, airflow entering the partially enclosed space 122 in the absence of the diffuser 10 would flow substantially parallel to the surfaces of the daughter boards 116, 118. Such parallel flow would be subject to boundary layer effects caused by flowing over the surface of the daughter boards 116, 118. By directing airflow onto the daughter boards 116, 118 the boundary layer effects are substantially eliminated and enhanced heat transfer may be achieved.

Figure 7:
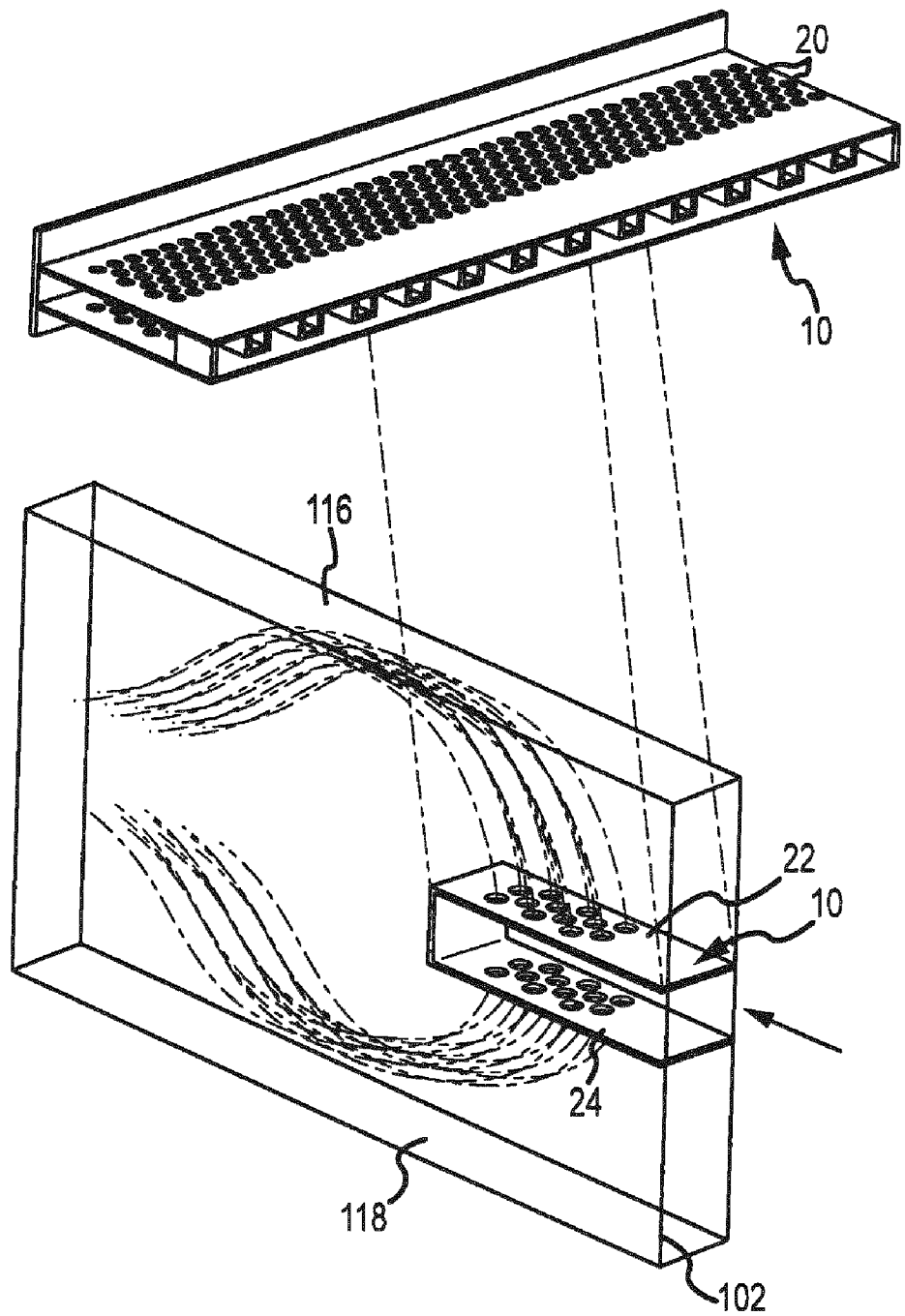
FIG. 7 is a perspective view of airflow through an air inlet EMI diffuser.

As further shown in FIGS. 2 and 7, the diffuser 10 is operative to direct airflow into the box 102B to a position that is past the internal components of the various connectors 110D that are interconnected to the daughter boards 116, 118. Furthermore, by utilizing the EMI apertures 20 on the top and bottom walls 22, 24 of the diffuser 10, airflow may be directed into the shadow, or lee, of the connectors 110 such that more of the surface area of each daughter board 116, 118 may receive airflow cooling.

To further enhance the airflow in a direction that is transverse to the inlet opening 106, the diffuser may incorporate an external baffle 50 as shown in FIG. 2. In this regard, the airflow passing through the EMI apertures 20 may be further directed towards a desired surface (e.g., daughter boards 116, 118). To achieve further enhanced cooling of the electronic circuitry within an electronics enclosure 100 it may be desirable that the airflow out of the EMI apertures 20 be turbulent airflow. In this regard, the size and/or shape of the EMI apertures may be selected to permit the airflow to become turbulent prior to reaching the surface of the daughter boards.

The foregoing description of the present invention has been presented for purposes of illustration and description. Furthermore, the description is not intended to limit the invention to the form disclosed herein. Consequently, variations and modifications commensurate with the above teachings, and skill and knowledge of the relevant art, are within the scope of the present invention. For instance, the air inlet diffusers disclosed above may be utilized to redirect air on vertically mounted PCBs and/or may be utilized for side-to-side/top-to-bottom airflow cooling as well. Furthermore, the shape of the diffuser may be varied and the redirection of air through the EMI apertures may likewise be varied. For instance, a circular diffuser may permit directing air in any radial direction. Further, while the diffusers discussed above are utilized for air inlet paths, such diffusers could also be utilized with air outlets. The embodiments described hereinabove are further intended to explain best modes known of practicing the invention and to enable others skilled in the art to utilize the invention in such, or other embodiments and with various modifications required by the particular application(s) or use(s) of the present invention. It is intended that the appended claims be construed to include alternative embodiments to the extent permitted by the prior art.

What is claimed is:

1. An electronics chassis adapted to house multiple independent electronics enclosures in stacked configuration, wherein at least one of the electronics enclosures comprises:
   a plurality of electrically conductive walls defining the enclosure, said enclosure including a front wall;
   at least a first and second set of pluggable connectors extending through said front wall of said enclosure for electrically connecting electrical cables to circuitry within the enclosure;
   a ventilation opening extending through said front wall of said enclosure, wherein said ventilation opening is at least partially disposed between said first and second sets of pluggable connectors; and
   a hollow air duct interconnected about a periphery of said ventilation opening and extending into the enclosure, wherein a plurality of apertures sized to attenuate electromagnetic interference (EMI) extend through a sidewall of said hollow air duct and wherein a combined area of said plurality of apertures is greater than an area of said ventilation opening.

2. The device of claim 1, wherein said combined area of said plurality of apertures is at least twice as large as said area of said ventilation opening.

3. The device of claim 1, wherein each of said plurality of said apertures has a maximum dimension of less than 5 mm.

4. The device of claim 1, wherein said enclosure includes a top wall and a bottom wall, and wherein said hollow air duct has a first set of apertures that face said top wall and a second set of apertures that face said bottom wall.

5. The device of claim 4, further comprising:
   a first electronics board attached relative to said top wall and a second electronics board attached relative to said bottom wall, wherein said first set of apertures face said first electronics board and said second set of apertures face said second electronics board.

6. The device of claim 1, wherein at least one set of said pluggable connectors comprise at least one RJ-45 connector or at least one small form factor pluggable (SFP) connector.

7. The device of claim 1, wherein said hollow air duct has a width that is greater than a length of the hollow air duct.

8. The device of claim 1, wherein said hollow air duct comprises:
   an open end adapted for disposition about the periphery of said ventilation opening and a closed end, wherein the sidewall extends between the open and closed ends, wherein at least a portion of said plurality of apertures extend through said sidewall.

9. The device of claim 8, wherein said sidewall further comprises:
a first section adjacent to said open end that is free of apertures.

10. The device of claim 1, wherein said hollow air duct is substantially rectangular in cross-section defining four side surfaces, wherein at least two of said four side surfaces each include a portion of said plurality of apertures.

11. The device of claim 1, further comprising:
a fan disposed in the electronics chassis, wherein said fan is adapted to draw ambient air through said ventilation opening into said hollow air duct and through the plurality of apertures.

12. The device of claim 1, wherein a maximum dimension of each of the plurality of apertures is inversely related to an operating frequency of electronic circuitry within the enclosure.

13. An EMI shielded electronics enclosure adapted for stacked disposition within an electronics chassis; said enclosure comprising:
a plurality of electrically conductive walls defining the enclosure, said enclosure including a front wall, top and bottom walls and first and second sidewalls;
first and second sets of pluggable connectors extending through said front wall of said enclosure for electrically connecting electrical cables to circuitry within the enclosure;
a ventilation opening extending through said front wall of said enclosure, wherein said ventilation opening is at least partially disposed between said first and second sets of pluggable connectors; and
a recessed EMI shield interconnected about the periphery of the ventilation opening and extending into the enclosure, wherein the recessed EMI shield includes a plurality of apertures sized to attenuate electromagnetic interference (EMI) and wherein a combined area of said plurality of apertures is greater than an area of said ventilation opening.

14. The device of claim 13, wherein said combined area of said plurality of apertures is at least twice as large as said area of said ventilation opening.

15. The device of claim 13, wherein each of said plurality of said apertures has a maximum dimension of less than 5 mm.

16. The device of claim 13, wherein said recessed EMI shield comprises:
an open end adapted for disposition about the periphery of said ventilation opening;
a closed end; and
a sidewall that extends between the open and closed ends, wherein at least a portion of said plurality of apertures extend through said sidewall.

17. The device of claim 16, wherein said sidewall has a first set of apertures that face said top wall and a second set of apertures that face said bottom wall.

18. The device of claim 17, further comprising:
a first electronics board attached relative to said top wall and a second electronics board attached relative to said bottom wall, wherein said first set of apertures face said first electronics board and said second set of apertures face said second electronics board.

19. The device of claim 17, wherein, at least a portion of said plurality of apertures extend through a portion of said sidewall that is substantially parallel to one of said top and bottom walls.

20. The enclosure of claim 13, further comprising:
a fan adapted to draw ambient air through said ventilation opening and through the plurality of apertures of the recessed EMI shield.

21. An electronics chassis adapted to house multiple independent electronics enclosures in stacked configuration, wherein at least one of the electronics enclosures comprises:
a plurality of electrically conductive walls defining the enclosure, said enclosure including a front wall, a top wall and a bottom wall;
a plurality of pluggable connectors extending through said front wall of said enclosure for electrically connecting electrical cables to circuitry within the enclosure;
a ventilation opening extending through said front wall of said enclosure; and
a hollow air duct interconnected about a periphery of said ventilation opening and extending into the enclosure, wherein a plurality of apertures sized to attenuate electromagnetic interference (EMI) extend through a sidewall of said hollow air duct and wherein a combined area of said plurality of apertures is greater than an area of said ventilation opening and wherein a first set of said apertures face said top wall and a second set of said apertures that face said bottom wall; and
a first electronics board attached relative to said top wall and a second electronics board attached relative to said bottom wall, wherein said first set of apertures face said first electronics board and said second set of apertures face said second electronics board.

* * * * *

UNITED STATES PATENT AND TRADEMARK OFFICE
CERTIFICATE OF CORRECTION

| | |
|---|---|
| PATENT NO. | : 8,085,554 B2 |
| APPLICATION NO. | : 12/553412 |
| DATED | : December 27, 2011 |
| INVENTOR(S) | : Holdredge et al. |

It is certified that error appears in the above-identified patent and that said Letters Patent is hereby corrected as shown below:

IN THE SPECIFICATIONS:

Column 3, line 5, delete "on" and insert therefor --one--.

Signed and Sealed this
Sixth Day of March, 2012

David J. Kappos
*Director of the United States Patent and Trademark Office*